(12) United States Patent
Sperlich et al.

(10) Patent No.: US 6,293,291 B1
(45) Date of Patent: Sep. 25, 2001

(54) METHOD AND APPARATUS FOR THE TREATMENT OF OBJECTS, PREFERABLY WAFERS

(75) Inventors: Hans-Peter Sperlich; Volker Gajewski, both of Dresden (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/289,491

(22) Filed: Apr. 9, 1999

(30) Foreign Application Priority Data

Apr. 9, 1998 (DE) ............................................. 198 16 221

(51) Int. Cl.$^7$ ...................................................... B08B 13/00

(52) U.S. Cl. ...................................... 134/104.1; 134/95.1

(58) Field of Search .................................. 134/95.1, 95.2, 134/95.3, 61, 66, 104.1; 118/704, 66

(56) References Cited

U.S. PATENT DOCUMENTS 5,522,724 * 6/1996 Heilmann et al. ...................... 432/18

FOREIGN PATENT DOCUMENTS 35 07 337 A1    9/1985 (DE) .
43 22 467 C1    4/1995 (DE) .

* cited by examiner

*Primary Examiner*—Philip R. Coe
(74) *Attorney, Agent, or Firm*—Herbert L. Lerner; Laurence A. Greenberg; Werner H. Stemer

(57) ABSTRACT

A method for the treatment of objects, preferably wafers, in a corresponding apparatus. The apparatus having at least two or more process chambers for receiving and treating the objects as well as a handling apparatus, for example a robot arm, for loading and unloading the process chambers. To date, all the process chambers have been loaded with the objects directly in succession. Accordingly, the actual treatment begins virtually simultaneously in all the process chambers. Furthermore, the necessary cleaning processes in the process chambers are also carried out virtually simultaneously. In order to increase the throughput of objects to be treated and to prevent or to minimize the overlapping of the cleaning processes, the invention proposes that, at the program start, at the beginning of the treatment method, the loading of the objects into the first process chamber and beginning of the treatment of the objects are effected, and that, subsequently, temporally staggered initial loading of the objects into the second process chamber and beginning of the treatment of the objects are effected. The temporally staggered initial loading of the individual process chambers can be effected by manual or computer-aided control of the apparatus. Furthermore, a corresponding apparatus is described.

12 Claims, 1 Drawing Sheet

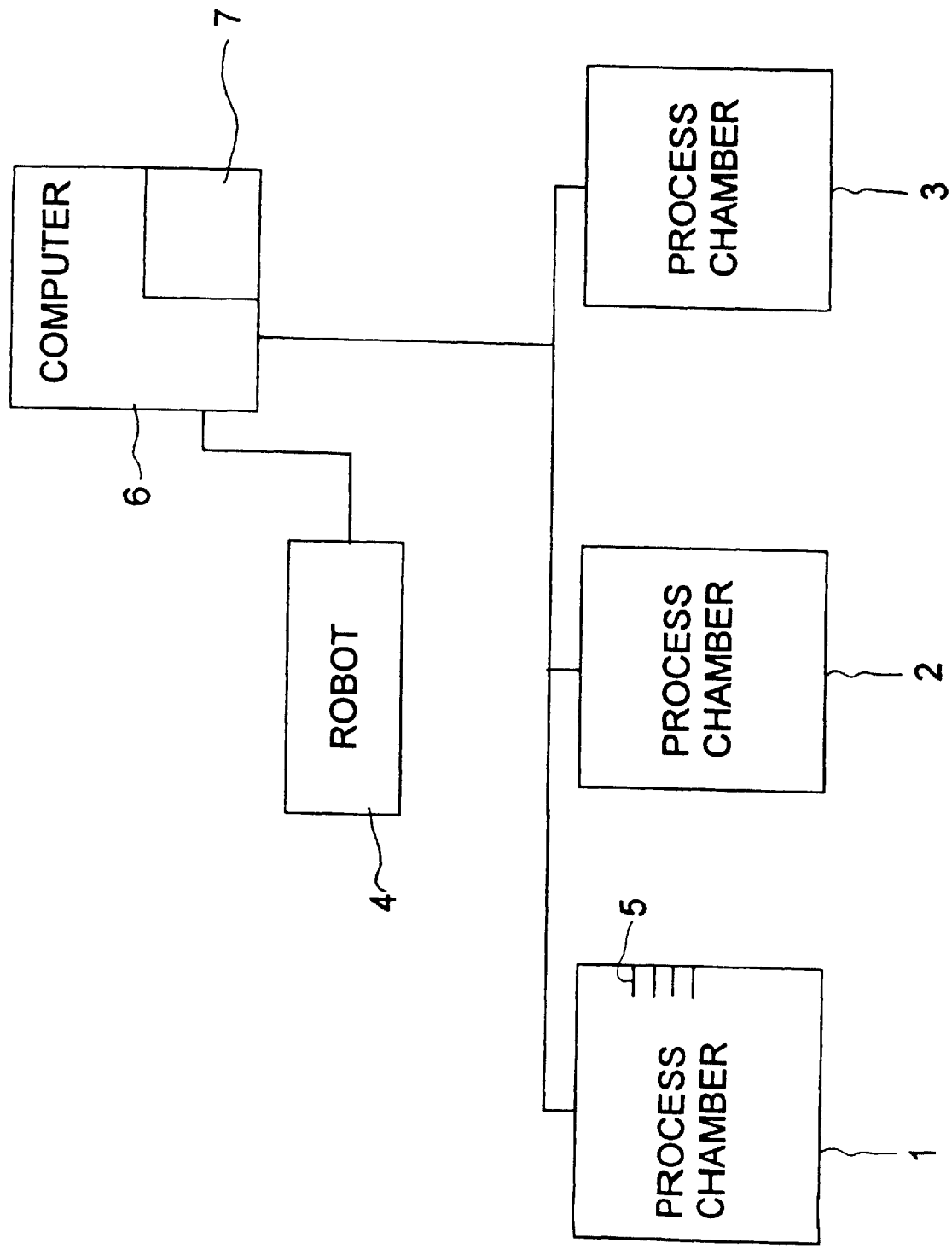

METHOD AND APPARATUS FOR THE TREATMENT OF OBJECTS, PREFERABLY WAFERS

BACKGROUND OF THE INVENTION

FIELD OF THE INVENTION

The present invention relates to a method for the treatment of objects, preferably wafers, in an apparatus for the treatment of objects, having at least two process chambers for receiving and treating the objects and a handling apparatus for loading and unloading the process chambers. Furthermore, the invention relates to a corresponding apparatus.

Such a method is used in the course of wafer coating, for example. The customary procedure in this case is that after the program start of the treatment method, firstly all of the process chambers are charged with the wafers to be processed by the handling apparatus. The treatment of the wafers then begins simultaneously in all of the process chambers. This has the disadvantage, however, that, in particular, time is lost and throughput losses arise because the capacity of the handling apparatus is limited. This results from the fact that when a plurality of process chambers are activated simultaneously, too many movements have to be executed by the handling apparatus per time period. Furthermore, during cleaning processes that are necessary within the process chambers and have to be carried out at regular intervals, idle times arise in the method, since the cleaning processes are carried out simultaneously in all of the process chambers. The handling apparatus is not used during the cleaning processes.

SUMMARY OF THE INVENTION

It is accordingly an object of the invention to provide a method and an apparatus for the treatment of objects, preferably wafers, that overcomes the above-mentioned disadvantages of the prior art devices of this general type.

With the foregoing and other objects in view there is provided, in accordance with the invention, an improved method for treating objects including wafers, the improvement which includes: initially loading a first batch of the objects to be treated into a first process chamber of a plurality of process chambers at a start of a cleaning program with a handling apparatus for loading and unloading the plurality of process chambers; starting a treatment process of the first batch of the objects to be treated; loading temporally staggered a second batch of the objects to be treated into a second process chamber with the handling apparatus; and starting the treatment process of the second batch of the objects to be treated.

In particular, the intention is to provide a method and an apparatus in which the throughput of objects to be treated in the process chambers is increased, and in which, in particular, overlapping of the necessary cleaning processes in the process chambers is prevented or minimized.

In accordance with a first aspect, the invention is achieved by a method described in the introduction which is characterized by the following steps: a) at the program start, loading of the objects into the first process chamber and the beginning of the treatment of the objects are effected; b) subsequently, the loading of the objects into the second process chamber and the beginning of the treatment of the objects are effected in a temporally offset manner by interposing a defined waiting time before the second process chamber is loaded.

In the first instance, the method according to the invention achieves an increase in the throughput of objects to be treated and hence in the productivity of the method and the capital efficiency. In particular, it is advantageous that the implementation of the method requires no structural changes at all to the apparatus for the treatment of the objects. Therefore, the method can be realized particularly cost-effectively and rapidly.

The temporally staggered initial loading of the objects into the individual process chambers provides a possible way of avoiding the disadvantages described above. By way of example, the temporally staggered initial loading and the consequentially temporally staggered beginning of the processing of the objects lead, in particular with continuous processing through the process chambers, to a throughput increase of up to 30% and thus to a considerable increase in efficiency. The reason for this results from the fact that the method according to the invention prevents idling during the necessary cleaning processes. The cleaning processes have to be carried out in each case after the process chambers have been running for a particular duration. The temporally staggered initial loading of the objects into the process chambers now results in that the cleaning processes are also carried out in a temporally staggered manner, with the result that the previously customary overlapping of the cleaning processes in the individual process chambers is obviated or minimized.

The result is a balanced method with a continuous and optimized throughput of objects.

Preferred objects that can be treated by the method according to the invention are wafers, which are coated, by way of example, in the individual process chambers. However, the invention is not restricted to the treatment of wafers, but rather can also be used for the treatment of other objects.

According to the invention, the method may furthermore be characterized by the following steps: c) unloading of the objects from the first process chamber after the end of treatment and renewed loading of objects to be treated into the first process chamber; and d) unloading of the objects from the second process chamber after the end of treatment and renewed loading of objects to be treated into the second process chamber.

In a further refinement, a third process chamber may be provided, in which case the initial loading of the objects into the third process chamber and hence the beginning of the treatment are effected in a temporally staggered manner with respect to the initial loading of the objects into the first and second process chambers. The use of three process chambers enables the throughput of the method to be further improved. Last but not least, the use of three process chambers makes it possible to save entire apparatuses for the treatment of objects. This is advantageous particularly when the apparatuses, for instance in the case of wafer treatment, are located in clean rooms, which usually have only a limited amount of available space. At this point, attention is drawn to the fact that the invention is not, of course, restricted to the use of a specific number of process chambers, so it is conceivable and possible for there also to be more than three process chambers for the implementation of the method.

The individual process chambers are preferably subjected to a cleaning process at intervals, the cleaning process in the individual process chambers being effected in a temporally staggered manner to the same extent as the initial loading and the beginning of the treatment of the objects in the respective process chambers.

In a further refinement, the temporally staggered initial loading and the beginning of the treatment of the objects in the process chambers may be effected temporally cyclically. As a result, the method can be controlled deliberately and in a particularly simple and temporally exact manner, which further improves the achievable throughput.

According to the invention, the temporally staggered initial loading and the beginning of the treatment of the objects in the process chambers may be effected at time intervals of 45 minutes or 90 minutes. These specified times are two advantageous exemplary time values. In principle, the invention is not restricted to specific time values. Rather, the requisite time values emerge from the respective treatment method and the resultant requirements. Typical values in the case of wafer treatment are in the time range of 5 minutes to 120 minutes, but may also go beyond this range.

According to the invention, the program start can be effected at the beginning of the treatment method after a first startup or after an operationally dictated stoppage of the apparatus for the treatment of the objects.

In one refinement, the temporally staggered beginning of the treatment of the objects in the process chambers after the program start can be controlled manually. This can be effected for example by manually putting the individual process chambers offline/online.

In a preferred refinement of the method, the temporally staggered initial loading and the beginning of the treatment of the objects in the process chambers after the program start can be controlled by a computer. In this case, it is possible to use the computer to set a variable time delay, specific to the method, for the initial loading and thus the beginning of the treatment in the individual process chambers. This time delay is defined with precision for the process chambers and is activated by the computer before the program start of the treatment method. Afterwards, and in this case particularly after the necessary cleaning processes, the time delay must, if appropriate, be deactivated again in order to guarantee a continuous sequence of the method after the program start. The time delay that can be set in the computer should be adjustable up to a four-digit seconds range in order that longer time delays for instance of more than an hour can also be realized.

According to the invention, the computer-aided control can be effected by the setting of a flag and/or by the staticizing of an instruction chain and/or by the processing of a release signal after the end of a stoppage time in the control program of the apparatus for the treatment of the objects.

By a corresponding flag, it is possible, by way of example, to activate the option for setting the time delay for the initial loading and thus the beginning of the treatment in the individual process chambers.

The instruction chain for activating the option for setting the time delay can be realized by a corresponding computer program, for example. This program must contain and take into account all of the necessary parameters with regard to the method parameters, the duration of treatment, the duration for the necessary cleaning processes and the like. The treatment method for the objects is usually composed of four main sections. The first section is the shutdown of the process chamber. The second section is the standby state (get ready, go clean, prepare, etc.), in which the process chamber is prepared for the above treatment of the objects. The third section includes the actual treatment of the objects, for example the deposition of materials on the objects, and the fourth section includes the cleaning process of the process chamber. The instruction chain for activating the option for setting the time delay can advantageously be implemented in that area of the computer program which controls the second section of the treatment method.

In a further refinement, the method for the treatment of the objects can proceed continuously after the program start. This increases the throughput further.

According to the invention, the treatment of the objects in the process chambers can have a plurality of preparation steps. Preferably, the temporally staggered beginning of the treatment of the objects in the individual process chambers can be controlled, after the program start of the treatment method, by way of the first preparation step. While the actual treatment method begins in the first process chamber, n the remaining process chambers the first preparation step, for example flushing with nitrogen, hydrogen or an inert gas (helium, argon), is protracted until the desired temporal staggering is reached. The method can then proceed in a temporally staggered manner in the individual chambers, as described above.

According to the invention, a robot, preferably a robot arm, can be used as the handling apparatus.

The inventive method for the treatment of objects, preferably wafers, can be used for a wide variety of purposes. Examples from the field of wafer treatment are, inter alia, the deposition of plasma silicon oxides/nitrides, the deposition of tungsten or titanium nitride barriers or the deposition of undoped/doped silicon oxides and silicon nitrides with the aid of high-density plasmas (HDP process) on the wafers.

In accordance with a second aspect of the present invention, a description is given of an apparatus for the treatment of objects, preferably wafers, in particular using the method according to the invention as described above, which has at least two process chambers for receiving and treating the objects and a handling apparatus for loading and unloading the process chambers. According to the invention, the apparatus is characterized in that it is configured to begin, at the program start of the treatment method, the treatment of the objects in the first process chamber, and then to begin, in a temporally staggered manner, the initial loading and the treatment of the objects in the second process chamber.

The apparatus according to the invention greatly increases the throughput of treated objects since, in particular, idle times that arise for the apparatus during the necessary cleaning processes in the individual process chambers are avoided. With regard to the advantages, actions, effects and the functioning of the apparatus, reference is made to the entire contents of the above explanations concerning the method according to the invention, which are hereby incorporated by reference.

According to the invention, the apparatus can be configured to unload the objects from the first process chamber after the end of treatment, and, in a temporally staggered manner with respect to this, to unload the objects from the second process chamber after the end of treatment.

In a further refinement, three process chambers may be provided, in which case the apparatus is configured to begin the initial loading and the treatment of the objects in the third process chamber in a temporally staggered manner with respect to the initial loading and treatment of the objects in the first and second process chambers.

Preferably, the apparatus may be configured to begin the treatment of the objects in the process chambers temporally cyclically and thus in a deliberately controlled manner.

The apparatus may advantageously be configured to begin the treatment of the objects in the process chambers in a temporally staggered manner at intervals of 5 minutes to more than 120 minutes.

According to the invention, provision may be made of an apparatus for manual control of the initial loading and of the beginning for the treatment of the objects in the individual process chambers.

In accordance with a further embodiment, provision may be made of a computer for control of the initial loading and of the beginning for the treatment of the objects in the individual process chambers.

In a preferred refinement, a control module for controlling the apparatus may be provided in the computer. The control module may advantageously be configured as a flag and/or as an instruction chain and/or as a release signal after a stoppage time of the apparatus.

According to the invention, the handling apparatus may be configured as a robot, preferably as a robot arm.

Other features which are considered as characteristic for the invention are set forth in the appended claims.

Although the invention is illustrated and described herein as embodied in a method and an apparatus for the treatment of objects, preferably wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The signal FIGURE of the drawing is a diagrammatic block diagram of an apparatus for cleaning objects according to the invention.

DESCRIPTION OF THE PREFERRED EMBODIMENTS

Referring now to the single figure of the drawing in detail, there is shown three process chambers 1, 2, 3. A handling apparatus 4 such as a robot having a robot arm is used for loading objects 5 such as wafers 5 into the process chambers 1–3. The process chambers 1–3 and the handling apparatus 4 can be manually operated. In the alternative, a computer 6 having a control module 7 is connected to the handling apparatus 4 and the process chambers 1–3 for controlling the handling apparatus 4 and the process chambers 1–3.

The invention will now be explained in more detail in an exemplary manner using an example. The example concerns a method for coating wafers 5 with tungsten. The method was carried out both in the manner known from the prior art and in the manner according to the invention.

According to the method known from the prior art, an apparatus having two process chambers 1, 2 for receiving and treating the wafers 5 is used for coating the wafers 5, the process chambers 1, 2 are loaded and unloaded by a robot arm 4. On account of the limitation of the capacity of the robot arm 4, which results from the fact that when a plurality of process chambers 1, 2 are activated simultaneously, too many movements have to be executed by the robot arm 4 per time period, only two process chambers 1, 2 can be used when the method known from the prior art is used.

Both process chambers 1, 2 were charged simultaneously with wafers 5 to be treated and then the treatment method was begun simultaneously in both process chambers 1, 2. Both process chambers 1, 2 can be operated for 2.5 hours before it is necessary to clean the process chambers 1, 2. The cleaning time of the process chambers 1, 2 is 45 minutes in each case. The process chambers 1, 2 can then be operated once again for 2.5 hours before a new cleaning process 45 minutes long has to be carried out. After the program start, at the beginning of the treatment method, the method can be carried out continuously.

In the first two hours for which the method was running, it was possible to achieve an average wafer 5 throughput of 90 wafers per hour. After 2.5 hours, a first cleaning process was carried out simultaneously in both process chambers 1, 2 over a period of 45 minutes, with the result that the average wafer throughput in the third and fourth hours fell to 75 and 73 wafers 5, respectively. The sharp decrease in the wafer throughput in the fourth hour additionally results from the fact that the two process chambers 1, 2 firstly had to be loaded again simultaneously with wafers 5 after the end of the cleaning process. In the fifth hour for which the method was running, the average wafer throughput was increased to 76 wafers per hour. At the end of the sixth hour, the next cleaning process in the process chambers 1, 2 was due.

Thus, after two complete treatment cycles of the method with a total duration of 6.5 hours, an average total throughput of wafers 5 of less than 69 wafers per hour was produced. In this case, one treatment cycle of the method corresponds to a period of 3.25 hours, composed of the treatment period of 2.5 hours and the cleaning process period of 45 minutes.

When the coating of wafers 5 with tungsten was carried out using the method according to the invention, two process chambers 1, 2 are likewise used. The limitation of the robot arm 4 capacity can be minimized in this case since, as a result of the temporally staggered beginning of the treatment method in the individual process chambers 1, 2 and the resultant temporal staggering of the cleaning processes, the process chambers 1, 2 do not, predominantly, have to be loaded and unloaded simultaneously. The stoppage times of the robot arm 4 during the cleaning process which are necessary in the method known from the prior art are omitted and the proportion of productive utilization of the robot arm 4 is considerably increased.

The process chambers 1, 2 can once again be operated for 2.5 hours before they each have to be subjected to a cleaning process for 45 minutes.

First of all, the first process chamber 1 was charged with wafers 5 and then the treatment method was begun in this chamber 1. With a gap of 60 minutes, the second process chamber 2 was then charged with wafers 5. The treatment method was subsequently begun in the second process chamber 2 as well. As a result of the temporal staggering of the beginning of the treatment method in the two process chambers 1, 2, in the first two hours for which the method was running only an average wafer throughput of, respectively 60 and 75 wafers 5 per hour was achieved.

However, the average wafer 5 throughput was able to be increased in the succeeding hours since the necessary cleaning processes of the process chambers 1, 2 after the treatment method had run for a period of 2.5 hours were carried out in a staggered manner in the same sense as the temporal staggering of the treatment method in the individual process chambers 1, 2 itself. Consequently, the first cleaning process in the second process chamber 2 was not begun until after the first cleaning process in the first process chamber 1 had been concluded. This made it possible to avoid stoppage times of the robot arm 4 during the cleaning processes since, during the cleaning process in one of the process chambers, the robot arm could in each case load the other process chamber with wafers and unload it.

Thus, in the method carried out according to the invention, it was possible to achieve an average wafer 5 throughput of 75 wafers 5 per hour in the third hour, 73 wafers 5 per hour in the fourth hour, 75 wafers 5 per hour in the fifth hour, 76.5 wafers 5 per hour in the sixth hour and 75 wafers 5 per hour in the seventh hour.

For the average wafer throughput over two treatment cycles of the treatment method, this produced an increase of 10% compared with the wafer throughput of the method known from the prior art.

As a result, it becomes clear that the method according to the invention and also the apparatus according to the invention are particularly suited to increasing the wafer throughput.

Furthermore, the method according to the invention and the apparatus according to the invention will also enable the practical use of three or more process chambers. The limitation of the robot arm capacity can be minimized in this case since, as a result of the temporally staggered beginning of the treatment method in the three process chambers 1–3 and the resultant temporal staggering of the cleaning processes, predominantly only two of the three process chambers 1–3 have to be loaded and unloaded simultaneously. As a result, increases in the average wafer throughput over two treatment cycles of the treatment method of 20% to 30% compared with the wafer throughput of the method known from the prior art may be expected.

A further advantage of the apparatus having three process chambers 1–3 results from the fact that a planned or unplanned failure of one of the three process chambers 1–3 will only slightly reduce the wafer 5 throughput through the apparatus. In contrast to this, in the case of an apparatus having only two process chambers 1, 2, the failure of one process chamber would result in a reduction in the wafer throughput of approximately 50%.

We claim:

1. An apparatus for treating objects including wafers, comprising:
    a plurality of process chambers including a first process chamber and a second process chamber for receiving and treating objects;
    a handling apparatus constructed for loading and unloading the objects to and from said plurality of process chambers, said handling apparatus beginning, at a program start, an initial loading of the objects in said first process chamber for treatment of the objects in said first process chamber and to begin, in a temporally staggered manner with respect to said program start, an initial loading of further objects in said second process chamber for treatment of the further objects in said second process chamber; and
    said handling apparatus constructed for unloading the first objects from said first process chamber after an end of the treatment and renewed loading of further objects to be treated into said first process chamber, and unloading the second objects from said second process chamber after an end of the treatment and renewed loading of further objects to be treated into said second process chamber.

2. The apparatus according to claim 1, wherein said handling apparatus unloads the objects from said first process chamber after an end of the treatment, and, in a temporally staggered manner with respect to this, unloads the further objects from said second process chamber after the end of the treatment.

3. The apparatus according to claim 1, wherein said plurality of process chambers includes a third process chamber, said third process chamber initially loaded with additional objects and then treating the additional objects in a temporally staggered manner with respect to the initial loading and the treatment of the objects and the further objects in said first and second process chambers, respectively.

4. The apparatus according to claim 1, wherein said plurality of process chambers and said handling device are configured to begin the initial loading and the treatment of the objects and the further objects in said plurality of process chambers temporally cyclically and thus in a deliberately controlled manner.

5. The apparatus according to claim 1, wherein said plurality of process chambers and said handling device are configured to begin the initial loading and the treatment of the objects and the further objects in said plurality of process chambers in a temporally staggered manner at intervals of 5 minutes to more than 120 minutes.

6. The apparatus according to claim 1, wherein said plurality of process chambers and said handling device are configured for manual control of the program start of the initial loading of the objects and the further objects into said plurality of process chambers.

7. The apparatus according to claim 1, including a computer connected to said handling apparatus for controlling the program start of the initial loading of the objects and the further objects into said plurality of process chambers.

8. The apparatus according to claim 7, wherein said computer has a control module generating a control signal for controlling said handling apparatus.

9. The apparatus according to claim 8, wherein said control signal is at least one of a flag, an instruction chain, and a release signal after a stoppage time of the apparatus.

10. The apparatus according to claim 1, wherein said handling apparatus is a robot.

11. The apparatus according to claim 1, wherein said handling apparatus is a robot arm.

12. An apparatus for treating objects including wafers, comprising:
    a plurality of process chambers including a first process chamber and a second process chamber for receiving and treating objects;
    a handling apparatus for loading and unloading the objects to and from said plurality of process chambers, said handling apparatus beginning, at a program start, an initial loading of the objects in said first process chamber for treatment of the objects in said first process chamber and to begin, in a temporally staggered manner with respect to said program start, an initial loading of further objects in said second process chamber for treatment of the further objects in said second process chamber;
    said handling apparatus constructed for unloading the first objects from said first process chamber after an end of the treatment and renewed loading of further objects to be treated into said first process chamber, and unloading the second objects from said second process chamber after an end of the treatment and renewed loading of further objects to be treated into said second process chamber; and
    said handling apparatus constructed for subjecting said first process chamber and said second process chamber, at intervals, to a cleaning process, the cleaning process in said process chambers effected in a temporally staggered manner to the same extent as the program start of the initial loading and the treatment of the objects in said process chambers.

* * * * *